United States Patent [19]

Kanoh

[11] Patent Number: 5,524,207
[45] Date of Patent: Jun. 4, 1996

[54] DATA PROCESSING DEVICE COMPRISING A MULTIPORT RAM AS A SEQUENTIAL CIRCUIT

[75] Inventor: Toshiyuki Kanoh, Tokyo, Japan

[73] Assignee: NEC Corporation, Japan

[21] Appl. No.: 922,830

[22] Filed: Jul. 31, 1992

[30] Foreign Application Priority Data

Jul. 31, 1991 [JP] Japan .................................. 3-280910

[51] Int. Cl.⁶ ..................................................... G06F 11/00
[52] U.S. Cl. ......................................................... 395/183.18
[58] Field of Search .............................. 371/21.1, 21.2, 371/15.1, 21.3, 21.5; 370/85.7, 41, 44, 46, 47, 110.3, 42, 43; 395/183.18, 183.13

[56] References Cited

U.S. PATENT DOCUMENTS

| | | | |
|---|---|---|---|
| 4,405,992 | 9/1983 | Blau et al. | 364/748 |
| 4,734,852 | 3/1988 | Johnson et al. | 364/200 |
| 4,766,564 | 8/1988 | DeGroot | 364/748 |
| 4,768,188 | 8/1988 | Barnhart et al. | 370/80 |
| 4,802,125 | 1/1989 | Yamada | 365/189 |
| 4,831,515 | 5/1989 | Kamada et al. | 364/200 |
| 4,835,774 | 5/1989 | Ooshima et al. | 371/21.2 |
| 4,908,825 | 3/1990 | Vea | 370/110.3 |
| 4,933,839 | 6/1990 | Kinoshita et al. | 364/200 |
| 4,962,500 | 10/1990 | Nakagawa | 371/21.2 |
| 5,056,089 | 10/1991 | Furuta et al. | 371/21.1 |
| 5,117,393 | 5/1992 | Miyazawa et al. | 365/201 |
| 5,132,973 | 7/1992 | Obermeyer | 371/21.1 |
| 5,224,101 | 6/1993 | Popyack, Jr. | 371/21.1 |
| 5,271,001 | 12/1993 | Hadano | 370/16 |
| 5,291,449 | 3/1994 | Dehara | 371/21.1 |

OTHER PUBLICATIONS

Patent Abstracts of Japan, vol. 13, No. 413 (E-820), Sep. 12, 1983 & JP-A-11 52 828 (Mitsubishi Electric Corp.) Jun. 15, 1989.

*Primary Examiner*—Robert W. Beausoliel, Jr.
*Assistant Examiner*—Joseph E. Palys
*Attorney, Agent, or Firm*—Ostrolenk, Faber, Gerb & Soffen

[57] ABSTRACT

In a data processing device for use in a carrier transmission system in processing a device input signal of a plurality of channels, a single data processing circuit (21) and a multiport RAM (33) are used together with a write and read clock counter (51(1)) in place of a great number of data processing circuits, equal in number to an integral multiple of the number of channels, and a likewise great number of sequential circuits, such as D-type flip-flops. Through a supply arrangement which is preferably a selector (41) for selectively supplying a test signal to the RAM, a processed output signal is supplied from the data processing circuit to the RAM as a processed input signal for storage as memorized signals according to the channels and for read out as a device output signal. If desired, additional clock counters (51(2) to 51(N)) are used for read out of the memorized signals as additional device output signals. The stored test signal may be read out as a RAM test output signal, which can be processed by the data processing circuit, supplied through the selector, stored in the RAM, and read out as a processing circuit test output signal.

7 Claims, 3 Drawing Sheets

DATA PROCESSING DEVICE COMPRISING A MULTIPORT RAM AS A SEQUENTIAL CIRCUIT

BACKGROUND OF THE INVENTION

1. Field of the Invention

This invention relates to a data processing device which includes a sequential circuit. Such a data processing device is used, for example, as a multiplexer circuit of a carrier transmission system, such as Network Node Interface standardized by the CCITT, in achieving frame synchronization and in executing pointer processing. The carrier transmission system is used in any one of wired, radio, and optical communications.

2. Description of the Related Art

For use as a device input signal, a combination of input data signals of first through P-th channels is supplied to a data processing device of the type described, where P represents a multiplexity of the device input signal by an integer which is not less than two. The data processing device is for processing the input data signals into output data signals of the first through the P-th channels and is for producing the output data signals collectively as a device output signal. In each of the device input and output signals, the data signals are multiplexed on or along a time axis, usually hierarchically or stratificationally in practice.

In the manner which will later be described in more detail, a conventional data processing device of this type comprises a demultiplexer for demultiplexing the device input signal into demultiplexed data signals of the first through the P-th channels. First through P-th data processing arrangements are for processing the demultiplexed data signals into the output data signals. A multiplexer multiplexes the output data signals into the device output signal.

Each data processing arrangement comprises a primary data processing unit or circuit for processing a pertinent one of the demultiplexed data signals into a primary processed output signal. A primary sequential circuit or unit processes the primary processed output signal into a sequenced signal. A secondary data processing unit processes a circuit input signal into a secondary processed output signal. The sequenced signal is supplied from the primary sequential unit to the secondary data processing unit as the circuit input signal. A secondary sequential unit processes the secondary processed output signal into a relevant one of the output data signals.

The conventional data processing device must therefore comprise the demultiplexer and the multiplexer. In addition, the conventional data processing device must comprise the data processing arrangements, equal in number to the multiplexity of the device input signal. This undesirably raises power consumption of the data processing device and results in an objectionably wide chip area when the data processing device is implemented by a semiconductor integrated circuit. The wide chip area gives rise to a low yield of the integrated circuit. Inasmuch as the sequential circuits are included, a large-scaled test circuit is indispensable to individually test the sequential units and the data processing units.

SUMMARY OF THE INVENTION

It is consequently a principal object of the present invention to provide a data processing device which comprises only a small number of circuit elements.

It is another principal object of this invention to provide a data processing device which is of the type described and which has a small power consumption.

It is still another principal object of this invention to provide a data processing device which is of the type described and which need not use a wide chip area when implemented by a semiconductor integrated circuit.

It is yet another principal object of this invention to provide a data processing device which is of the type described and which has a high yield when implemented by a semiconductor integrated circuit.

It is a subordinate object of this invention to provide a data processing device which is of the type described and which includes a built-in test circuit.

Other objects of this invention will become clear as the description proceeds.

On setting forth the gist of this invention, it is possible to understand that a data processing device comprises a data processing circuit for processing a device input signal into a processed output signal, a sequential circuit for processing a processed input signal into a device output signal, and supply means for supplying the processed output signal to the sequential circuit as the processed input signal. It should be noted in connection with the foregoing that the device input signal is obtained by multiplexing input data signals of a plurality of channels.

According to this invention, the sequential circuit of the above-understood data processing device comprises multiport random access memory means for memorizing the processed input signal as memorized signals according to the channels and for producing the memorized signals as the device output signal.

DESCRIPTION OF THE PREFERRED EMBODIMENT

Figure 1:
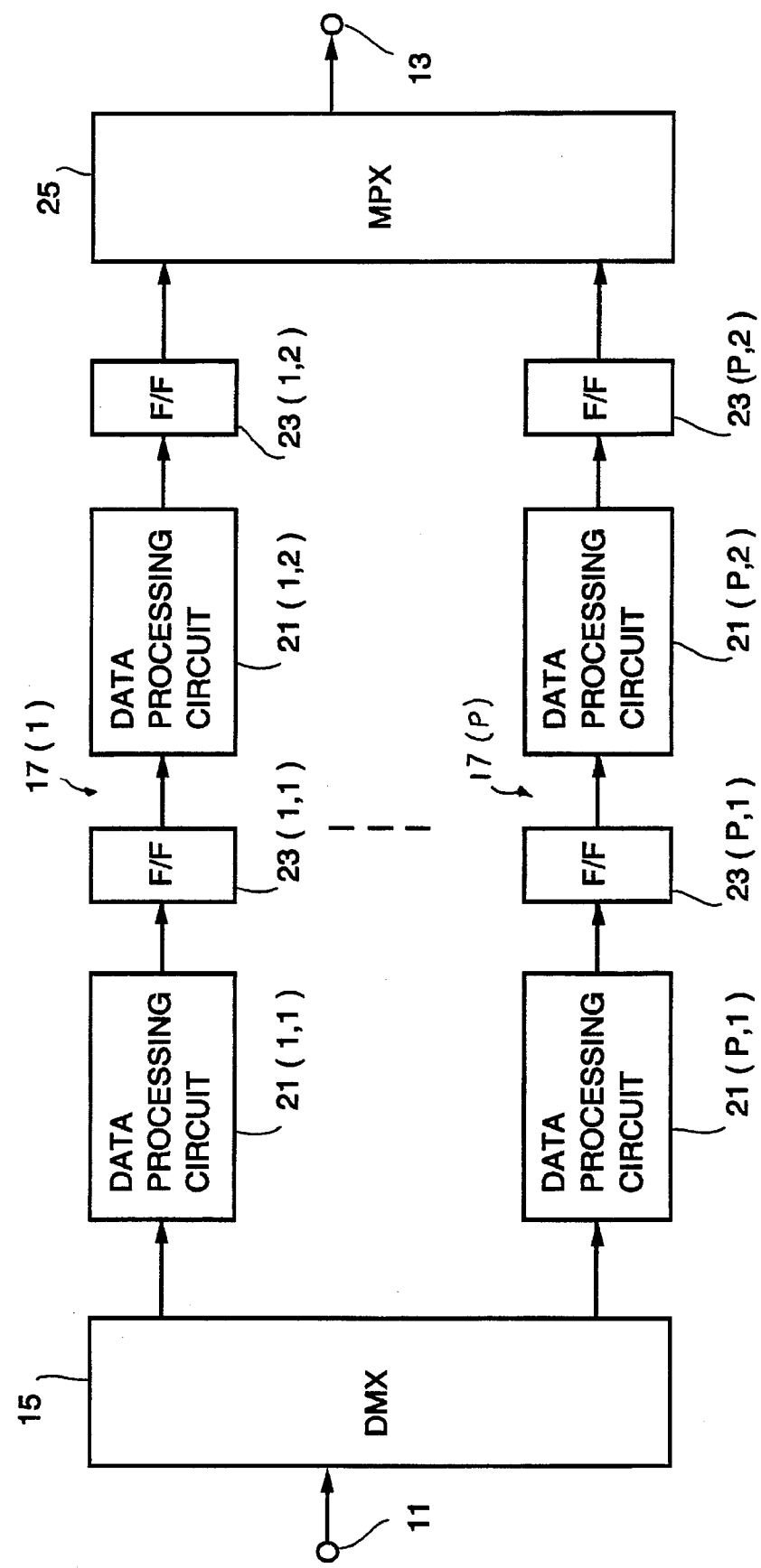
FIG. 1 is a block diagram of a conventional data processing device.

Referring to FIG. 1, a conventional data processing device will first be described in order to facilitate an understanding of the present invention. The data processing device has device input and output terminals 11 and 13.

The device input terminal 11 is supplied with a device input signal, into which input data signals of first through P-th channels are multiplexed on or along a time axis, where P represents a multiplexity of the device input signal by an integer which is not less than two. The data processing device is for delivering a device output signal through the device output terminal 13 to a utilization device (not shown) of a carrier transmission system.

Through the device input terminal 11, the device input signal is supplied to a demultiplexer (DMX) 15 and is demultiplexed into first through P-th demultiplexed signals. Each of the demultiplexed signals will be called a p-th demultiplexed signal where p is variable between 1 and P, both inclusive.

First through P-th data processing arrangement 17(1), 17(2), ..., and 17(P) are connected to the demultiplexer 15. In the manner which will shortly be described, the first through the P-th data processing arrangements 17 (suffixes omitted) have a common structure. Each of the data processing arrangements 17 will be referred to as a p-th data processing arrangement 17(p) in correspondence to the p-th demultiplexed signal. The p-th data processing arrangement 17(p) is for processing the p-th demultiplexed signal in the manner which will be described in the following.

The p-th data processing arrangement 17(p) comprises a p-th primary data processing unit 21(p, 1) which has a primary circuit input terminal supplied with the p-th demultiplexed signal as a p-th primary circuit input signal and processes the p-th primary circuit input signal into a p-th primary processed output signal. Supplied with the p-th primary processed output signal as a p-th primary processed input signal, a p-th primary sequential unit (F/F) 23(p, 1) processes the p-th primary processed input signal into a p-th primary sequenced signal.

A p-th secondary data processing unit 21(p, 2) has a secondary circuit input terminal supplied with the p-th primary sequenced signal as a p-th secondary circuit input signal to process the p-th secondary circuit input signal into a p-th secondary processed output signal. Supplied with the p-th secondary processed output signal as a p-th secondary processed input signal, a p-th secondary sequential unit (F/F) 23(p, 2) processes the p-th secondary processed input signal into a p-th secondary sequenced signal.

Each of first through P-th primary and secondary data processing units 21(1, 1) to 21(p, 1) and 21(1, 2) to 21(p, 2) is composed of a combination of logic circuits in the manner known in the art. Each of first through p-th primary and secondary sequential units 23(1, 1) to 23(p, 1) and 23(1, 2) to 23(p, 2) is typically a D-type flip-flop.

Processing the first through the P-th demultiplexed signals in this manner, the data processing arrangements 17 produce first through P-th secondary sequenced signals as first through P-th output data signals. A multiplexer (MPX) 25 multiplexes the output data signals into the device output signal and delivers the device output signal to the device output terminal 13.

In the manner described heretofore, the conventional data processing device must comprise the demultiplexer 15 and the multiplexer 25. Furthermore, the data processing arrangements 17 must be equal in number to the multiplexity P.

When a great number of input data signals are multiplexed into the device input signal, the data processing device must comprise an accordingly great number of circuit elements, such as the data processing units and the sequential units in addition to the demultiplexer 15 and the multiplexer 25. This undesirably raises power consumption of the data processing device and gives rise to an objectionably wide chip area when the data processing device is implemented by a semiconductor integrated circuit. The wide chip area results in a low yield of the integrated circuit. Inasmuch as the sequential units are included, a test circuit of a large scale is indispensable.

Figure 2:
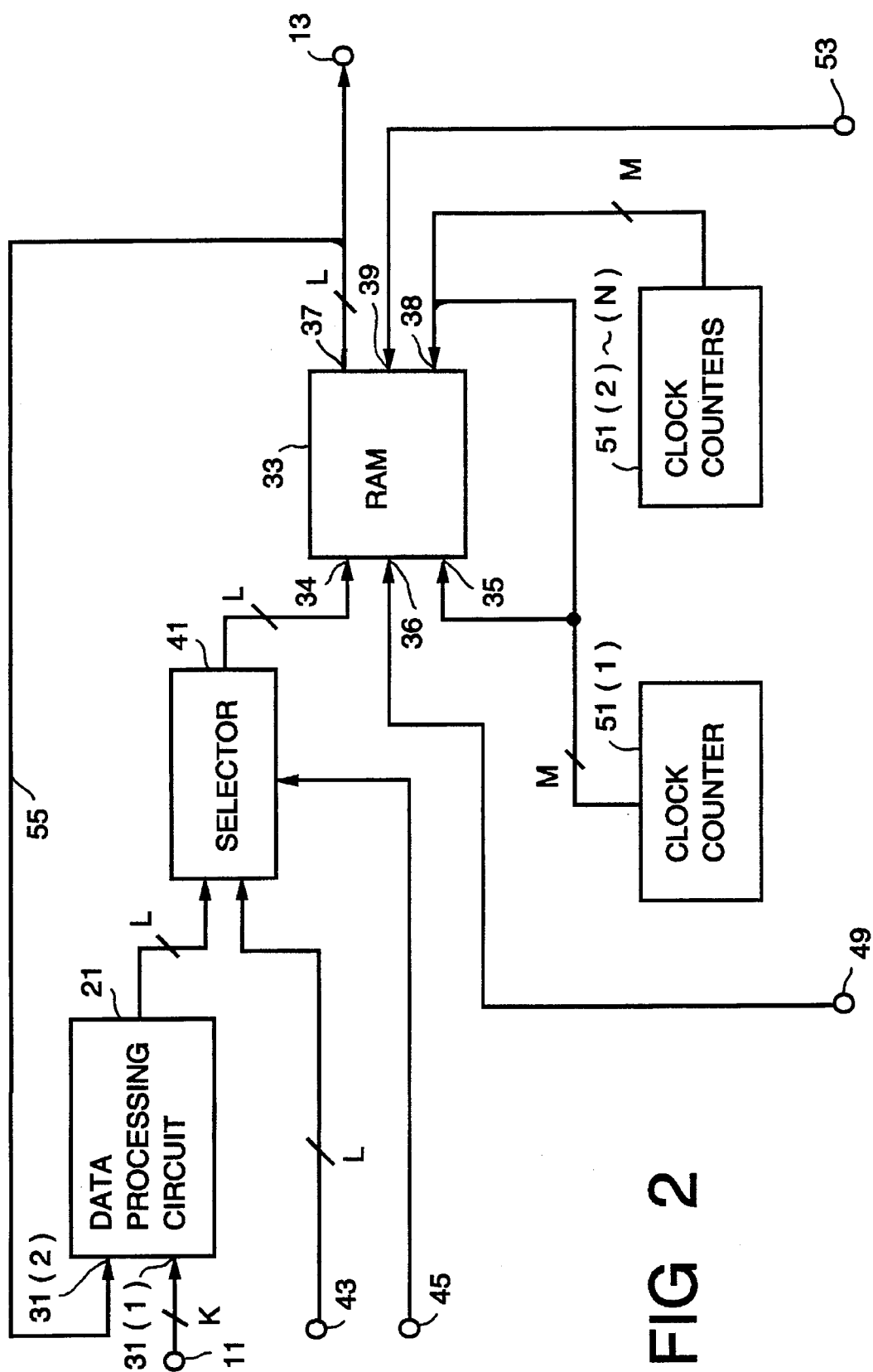
FIG. 2 is a schematic block diagram of a data processing device according to an embodiment of the instant invention.

Referring now to FIG. 2, the description will proceed to a data processing device according to a preferred embodiment of this invention. In FIG. 2, the data processing device comprises similar parts which are designated by like reference numerals and are similarly operable with likewise named signals unless otherwise specified in the following.

More particularly, the illustrated data processing device has a device input terminal which is equivalent to the device input terminal 11 described in conjunction with FIG. 1 and is consequently designated by the reference numeral 11. The data processing device has first through N-th device output terminals 13(1), 13(2), ..., and 13(N), where N represents an integer which is not less than one and is determined in the manner later described. Merely for simplicity of illustration, the device output terminals 13(1) through 13(N) are collectively depicted as a single device output terminal 13.

For the data processing device being illustrated, the device input signal is illustrated as a K-bit input signal, where K represents an integer which is not less than one. As before, input data signals of the first through the P-th channels are multiplexed into the K-bit input signal on a time axis.

It will be surmised that each of the input data signals is an L-bit bit-parallel signal, where L represents an integer which is not less than one and may be equal to an integral multiple of nine and be as great as one hundred. The K-bit input signal has a bit rate which is typically equal to an even multiple of 19.44 MHz and may be as high as 77.76 MHz at present.

In the data processing device being illustrated, a data processing circuit is an equivalent of each of the first through the P-th primary and secondary data processing units 21(1, 1) to 21(P, 1) and 21(1, 2) to 21(P, 2) described in conjunction with FIG. 1. The data processing circuit under consideration is, however, operable as an overall combination of the first through the P-th primary and secondary data processing units in the manner which will presently be described. The data processing circuit is therefore designated by the reference numeral 21.

For convenience of the description which follows, the data processing unit 21 is depicted as having first and second circuit input terminals 31(1) and 31(2) which serve as the primary and the secondary circuit input terminals. More specifically, the first circuit input terminal 31(1) is supplied with the K-bit input signal as the device input signal from the device input terminal 11.

In the manner which will later be described, the second circuit input terminal 31(2) is supplied with an L-bit circuit input signal. The data processing circuit 21 processes into an L-bit processed output signal one of the device input signal and the circuit input signal that is actually supplied to the data processing circuit 21.

Instead of the first through the P-th primary and secondary sequential units 23(1, 1) to 23(p, 1) and 23(1, 2) to 23(P, 2) described with reference to FIG. 1, the illustrated data processing device comprises a clock-synchronized $2^M$-word multiport random access memory (RAM) 33 for L-bit words, where M represents an integer which is not less than one and is less than ($\log_2 P+1$). In other words, the multiport random access memory 33 has a memory section or sector which is for memorizing the L-bit words, $2^M$ in number.

A data input terminal 34, a write address terminal 35, a write control terminal 36, first through N-th data output terminals 37(1), 37(2), ..., and 37(N), first through N-th read address terminals 38(1), 38(2), ..., and 38(N), and first through N-th read control terminals 39(1), 39(2), ..., and 39(N) of the multiport random access memory 33 are connected to the memory section in the manner known in the art. The first through the N-th data output terminals 37(1) to 37(N) are connected to the first through the N-th device output terminals 13.

Like the first through the N-th device output terminals 13, the first through the N-th data output terminals 37(1) to 37(N) are depicted collectively as a single data output terminal 37. The first through the N-th read address terminals 38(1) to 38(N) are illustrated as a sole read address terminal 38. The first through the N-th read control terminals 39(1) to 39(N) are shown as an only one read control terminal 39.

Between the data processing circuit 21 and the multiport random access memory 33, a data/test selector 41 is interposed and has a first selector input terminal supplied with the L-bit processed output signal from the data processing circuit 21, a second selector input terminal supplied with an L-bit test signal from a test input terminal 43, and a data/test selection terminal supplied from a selection signal input terminal 45 with a one-bit data/test selection signal representative of one of two values at a time. It will be presumed without loss of generality that the selector 41 selects the signals supplied to the first and the second selector input terminals when the data/test selection signal has binary one and zero values, respectively.

Under the circumstances, the test signal should be supplied to the test input terminal 43 when the data/test selection signal is given the binary zero value. The test signal may or may not be supplied to the test input terminal 43 when the data/test selection signal is given the binary one value. Selecting the signal supplied to the first selector input terminal, the selector 41 supplies the processed output signal to the data input terminal 34 of the multiport random access memory 33 as an L-bit processed input signal.

A device clock sequence of device clock pulses is supplied to the data processing device in synchronism with the K-bit input signal. In the manner which will later be exemplified, a write clock sequence of write clock pulses is derived from the device clock sequence with the write clock pulses synchronized with the device clock pulses and is supplied to a write clock input terminal 49.

Supplied with the write clock sequencer a write and read clock counter serves as a first M-bit clock counter 51(1) for producing a write and read or first M-bit address signal in synchronism with the write clock sequence. Similarly, second through N-th M-bit clock counters 51(2) to 51(N) produce second through N-th M-bit address signals. Each of the first through the N-th clock counters 51 (suffixes omitted) has a full count which is equal to M.

The first address signal is supplied to the write address terminal 35 of the multiport random access memory 33 as a write address signal. The write clock sequence is supplied to the write control terminal 36 as a write control signal.

The first address signal is supplied furthermore to the first read address terminal 38(1) as a first read address signal through a delay circuit which is not shown merely for simplicity of illustration and which preferably gives a delay of one clock period of the device clock sequence to the first address signal. The second through the N-th address signals are supplied to the second through the N-th read address terminals 38(2) to 38(N) as second through N-th read address signals.

Like the write clock sequence, first through N-th read clock sequences are derived from the device clock sequence with their clock pulses synchronized with the device clock pulses and are supplied to first through N-th read clock input terminals 53(1), 53(2), ..., and 53(N) which are collectively illustrated as a single read clock input terminal 53. The first through the N-th read clock sequences are supplied to the first through the N-th read control terminals 39 as first through N-th read control signals.

It will be surmised during a short while that the data/test selection signal is supplied to the selection signal input terminal 45 with the binary one value. When produced in response to each frame of the K-bit input signal, the processed input signal is stored in timed relationships with the write control signal in the memory section of the multiport random access memory 33 as memorized signals in response to the write address signal, namely, in accordance with the first through the P-th channels.

Attention will first be directed to the first read address signal alone. Timed by the first read control signal and accessed by the first read address signal, the memorized signals are read from the memory section collectively as a read data signal at the first data output terminal 37(1) of the multiport random access memory 33 and delivered to the first device output terminal 13(1). It is possible to store the K-bit input signal of another frame in the memory section while the memorized signals are read from the memory section.

In the read data signal, the input data signal of the first through the P-th channels are multiplexed on or along the time axis each time when the first clock counter 51(1) counts up to the full count. The read data signal is consequently the device output signal described before and will be called a first device output signal.

It is now understood that the data processing circuit 21 serves as the overall combination of the first through the P-th primary and secondary data processing units 21(1,1) to 21(P, 1) and 21(1, 2) to 21(P, 2) described in connection with FIG. 1. The data processing circuit 21 alone is therefore used in the data processing device being illustrated in common to the first through the P-th channels.

As a consequence, it is possible to cope with an increase in the multiplexity P by merely increasing the number of words in the memory section of the multiport random access memory 33 and increasing the full count M of each of the first through the N-th clock counters 51. It should be noted in this connection that the second through the N-th clock counters 51(2) to 51(N), the second through the N-th read clock input terminals 53(2) to 53(N), the second through the N-th device output terminals 13(2) to 13(N), and related terminals of the multiport random access memory 33 are unnecessary insofar as the data processing device is so far described.

In contrast to the above, it is often desired in FIG. 1 to make the p-th data processing arrangement 17(p) comprise three or more sequential units. Such a data processing device is implemented by using in the data processing device illustrated with reference to FIG. 2 three or more M-bit clock counters, namely, by using the second and the third or other additional clock counters, such as 51(2) and others, besides the first clock counter 51(1).

It will be supposed that the integer N is equal to three. In other words, it will be supposed that the second and the third clock counters 51(2) and 51(3) are used in addition to the first clock counter 51(1). In such an event, the second and the third read clock sequences are used together with the first clock sequence.

Figure 3:
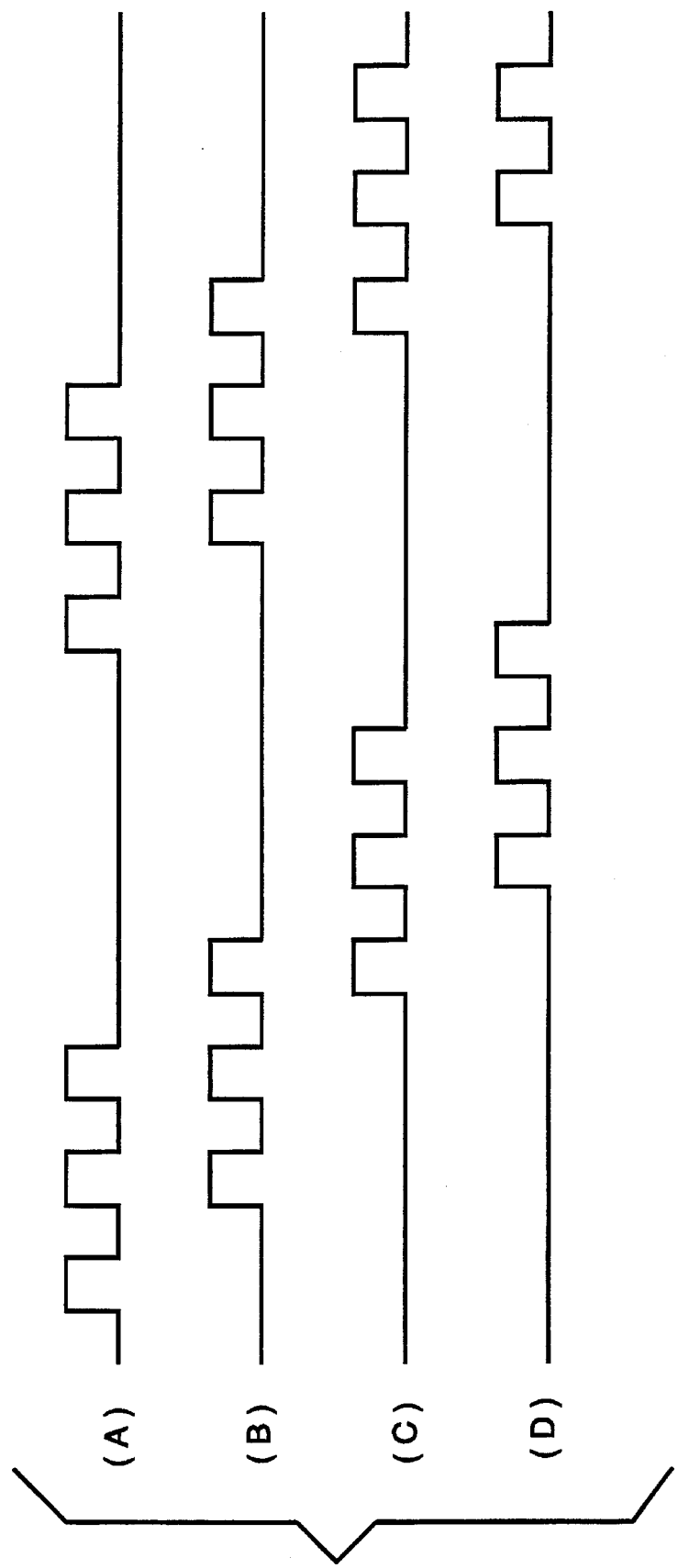
FIG. 3, drawn below FIG. 1 merely for convenience of illustration, is a time chart for use in describing operation of the data processing device depicted in FIG. 2.

Referring temporarily to FIG. 3, the write clock sequence is exemplified along a first or top row labelled (A). The first read clock sequence is illustrated along a second row labelled (B) in correspondence to the write clock sequence exemplified in the first row. Similarly, the second read clock sequence is depicted along a third row labelled (C) and the third read clock sequence, along a fourth or bottom row labelled (D).

In FIG. 3, the write clock pulses and similar clock pulses are produced at the clock period of the device clock sequence. Three clock pulses are grouped into a clock pulse group. This is in correspondence to the integer N which is now equal to three. Such a clock pulse group is depicted with a space of 2(N−1) clock periods from another. This is merely for clarity of the illustration. In practice, each clock pulse group is followed by another without such a space.

Referring back to FIG. 2, the first clock counter 51(1) counts the write clock pulses repeatedly from 1 up to its full count M. This applies equally well even when each clock pulse group is spaced from another. Similarly, an n-th clock counter 51(n) counts the clock pulses of an n-th read clock sequence, where n is variable between 2 and N, both inclusive.

The second through the N-th clock counters 51(2) to 51(N) are now used in addition to the first clock counter 51(1) and the second through the N-th read control signals, together with the first read control signal. By so using the first read address signal, the memorized signals are read from the memory section of the multiport random access memory 33 P times at the first data output terminal 37(1), each time as an L-bit read signal of the first device output signal.

A connection 55 connects the first data output terminal 37(1) to the second circuit input terminal 31(2). As a result, each read signal is fed back to the data processing circuit and processed as the circuit input signal by the data processing circuit 21 into the processed output signal. As before, the data/test selector 41 supplies the processed output signal to the data input terminal 34 of the multiport random memory 33 as the processed input signal.

Timed by the write control signal and specified by the write address signal, the processed input signal is stored in the memory section as the memorized signals according to the first through the P-th channels. The memorized signals are read in response to the second and the third read address signals and the second and the third read control signals at the second and the third data output terminals 37(2) and 37(3) and are delivered to the second and the third device output terminals 13(2) and 13(3) as second and third device output signals.

Reviewing FIGS. 1 and 2, a combination of the first through the P-th primary and secondary sequential units 23(1, 1) to 23(p, 1) and 23(1, 2) to 23(p, 2) and, if any, other sequential units will be called a sequential circuit. In the data processing device illustrated with reference to FIG. 2, the sequential circuit comprises a multiport random access memory arrangement which comprises the multiport random access memory 33 and the first clock counter 51(1).

In FIG. 2, the data/test selector 41 serves as a first supply arrangement which may be referred to simply as a supply arrangement. The connection 55 serves as a second supply arrangement which may be called an additional supply arrangement. The multiport random access memory arrangement (33, 51(1)) may or may not further comprise the second through the N-th M-bit clock counters 51(2) to 51(N).

It will now be surmised that the selection signal input terminal 45 is supplied with the data/test selection signal indicative of the binary zero value with the test signal supplied to the test input terminal 43. The data/test selector 41 supplies the test signal as a test input signal to the data input terminal 34 of the multiport random access memory 33. Although the test signal is not actually processed by the data processing circuit 21, the test input signal may be referred to as a processed input signal depending on the circumstances.

By using the write address and control signal, the test input signal is stored successively in the memory section of the multiport random access memory 33 as the memorized signals. It is consequently possible to monitor the multiport random access memory 33 at the first data output terminal 37(1) or at the first device output terminal 13(1) by reading the memorized signals by using the first read address and control signals. In this event, the first device output signal may be called a sequential circuit test output signal.

With the data/test selection signal given the binary one value, the test output signal can be supplied to the second circuit input terminal 31(2) of the data processing circuit 21 through the connection 55. The test output signal is now processed into the processed output signal for supply through the selector 41 actually as the processed input signal to the multiport random access memory 33 and is successively stored in the memory section as the memorized signals. When read at the first data output terminal 37(1), the memorized signals are delivered to the first device output terminal 13(1) as a processing circuit test output signal for use in monitoring the data processing circuit 21.

It is now understood that the data processing device comprises a simple and compact test circuit for use in individually monitoring the multiport random access memory 33 and the data processing circuit 21. Furthermore, it is possible to give a desired test pattern to the test signal.

While this invention has thus far been described in specific conjunction with a sole embodiment thereof, it will now be readily possible for one skilled in the art to put this invention into practice in various other manners. For example, it is possible to use a bit serial signal as each of the L-bit signals and like signals. Furthermore, it is possible to substitute a combination of a write clock counter and a first read clock counter for the illustrated combination of the first M-bit clock counter 51(1) and the delay circuit.

What is claimed is:

1. A data processing device comprising:

a data processing circuit for processing an input signal and a feedback signal, wherein said input signal comprises one of a plurality of signals multiplexed from a plurality of P channels;

a sequential circuit for receiving and storing said processed signal from said data processing circuit and for outputting said stored signal into a device output signal; and means for supplying said stored signal to said data processing circuit as said feedback signal;

wherein said sequential circuit comprises:

a write and read clock counter for producing an M-bit write and read address signal, where M represents an integer which is not less than one and is less than ($\log_2 P+1$), said write and read clock counter being a first M-bit clock counter for producing said write and read address signal as a first address signal to make said multiport random access memory produce said device output signal as a first device output signal;

second through N-th M-bit clock counters for producing second through N-th address signals, where N represents an integer which is not less than two; and a multiport random access memory supplied with said processed signal and said write and read address signal for storing said supplied signals and for outputting said stored signals as one of said device output signal and said feedback signal, said multiport random access memory being supplied with said second through N-th address signals in addition to said first address signal to output said stored signals as second through N-th device output signals in addition to said first device output signal.

2. A data processing device as claimed in claim 1, said data processing device being supplied additionally with a test signal, and further comprising a supply means disposed between said data processing circuit and said sequential circuit for supplying alternatively said processed signal and said test signal selectively to said sequential circuit.

3. A data processing device as claimed in claim 2, wherein said sequential circuit outputs said device output signal as a sequential circuit test output signal when supplied with said test signal as said processed signal.

4. A data processing device as claimed in claim 3, wherein:

said means for supplying said stored signal supplies said sequential circuit test output signal to said data processing circuit as said input signal;

said data processing circuit processes said input signal into a test output signal;

said supply means supplying said test output signal to said sequential circuit; and said sequential circuit outputs said device output signal as a device test output signal when supplied with said test input signal.

5. The data processing device of claim 1, wherein said device output signal comprises said input signal processed at least once by said data processing circuit.

6. A method of processing data, comprising the steps of:

processing an input signal and a feedback signal in a data processing circuit, wherein said input signal comprises one of a plurality of signals multiplexed from a plurality of P channels;

receiving and storing said processed signal in a sequential circuit;

feeding back said stored signal to said data processing circuit as said feedback signal;

outputting said stored signal from said sequential circuit as an output signal;

producing an M-bit write and address signal, where M represents an integer which is not less than on and is less than $(\log_2 P+1)$;

receiving, storing and outputting said processed signal using said sequential circuit;

producing second through N-th M-bit write and read address signals, wherein N represents an integer which is not less than two; and receiving and storing said processed signal and said second through N-th M-bit address signals using said sequential circuit.

7. The method of processing data as claimed in claim 6, further comprising the steps of:

supplying a test signal to said sequential circuit;

receiving and storing said test signal selectively in said sequential circuit.

* * * * *